United States Patent
Negley

(10) Patent No.: US 8,378,461 B2
(45) Date of Patent: Feb. 19, 2013

(54) LIGHT-EMITTING DEVICES HAVING AN ACTIVE REGION WITH ELECTRICAL CONTACTS COUPLED TO OPPOSING SURFACES THEREOF

(75) Inventor: Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 36 days.

(21) Appl. No.: 12/463,736

(22) Filed: May 11, 2009

(65) Prior Publication Data

US 2009/0224281 A1    Sep. 10, 2009

Related U.S. Application Data

(62) Division of application No. 10/818,619, filed on Apr. 6, 2004, now Pat. No. 7,531,380.

(60) Provisional application No. 60/466,617, filed on Apr. 30, 2003.

(51) Int. Cl.
*H01L 29/40* (2006.01)

(52) U.S. Cl. ............. 257/621; 257/79; 257/94; 257/99; 257/E33.001

(58) Field of Classification Search ............... 257/79, 257/94, 99, 621

See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,272,108 A | 12/1993 | Kozawa |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,670,798 A | 9/1997 | Schetzina |
| 5,739,554 A | 4/1998 | Edmond et al. |
| 5,767,581 A | 6/1998 | Nakamura et al. |
| 5,905,275 A * | 5/1999 | Nunoue et al. .................. 257/95 |
| 5,912,477 A | 6/1999 | Negley |
| 6,120,600 A | 9/2000 | Edmond et al. |
| 6,121,638 A * | 9/2000 | Rennie et al. ................. 257/103 |
| 6,177,688 B1 | 1/2001 | Linthicum et al. |
| 6,187,606 B1 | 2/2001 | Edmond et al. |

(Continued)

FOREIGN PATENT DOCUMENTS

| | | |
|---|---|---|
| JP | 8-083929 A | 3/1996 |
| JP | 8083929 A | 3/1996 |
| JP | 8255926 A | 10/1996 |
| JP | 10-084167 A | 3/1998 |
| JP | 10-270802 A | 10/1998 |
| KR | 10-1997-0706618 | 11/1997 |
| WO | WO 96/09653 | 3/1996 |

OTHER PUBLICATIONS

International Search Report corresponding to PCT/US2004/011358; Date of Mailing Sep. 7, 2004. Korean Non-Final Office Action Corresponding to Korean Patent Application No. 10-2010-7029479 (English Translation); Dated Mar. 11, 2011; 5 Pages.
Non-Final Office Action Corresponding to U.S. Appl. No. 12/241,665; Mail Date: Jul. 5, 2011; 11 Pages.

*Primary Examiner* — Wai Sing Louie

(74) *Attorney, Agent, or Firm* — Myers Bigel Sibley & Sajovec, P.A.

(57) ABSTRACT

A light-emitting device comprises a substrate that has a contact plug extending therethrough between first and second opposing surfaces. An active region is on the first surface, a first electrical contact is on the active region, and a second electrical contact is adjacent to the second surface of the substrate. The contact plug couples the second electrical contact to the active region. Such a configuration may allow electrical contacts to be on opposing sides of a chip, which may increase the number of devices that may be formed on a wafer.

15 Claims, 6 Drawing Sheets

U.S. PATENT DOCUMENTS

| | | |
|---|---|---|
| 6,201,262 B1 | 3/2001 | Edmond et al. |
| 6,201,265 B1 * | 3/2001 | Teraguchi ............... 257/99 |
| 6,268,660 B1 | 7/2001 | Dhong et al. |
| 6,542,530 B1 | 4/2003 | Shieh et al. |
| 6,657,237 B2 * | 12/2003 | Kwak et al. ............. 257/99 |
| 2002/0017653 A1 | 2/2002 | Chuang |
| 2002/0121642 A1 | 9/2002 | Doverspike et al. |
| 2002/0123164 A1 | 9/2002 | Slater, Jr. et al. |
| 2003/0006418 A1 | 1/2003 | Emerson et al. |
| 2003/0160258 A1 | 8/2003 | Oohata |
| 2004/0056260 A1 | 3/2004 | Slater, Jr. et al. |

* cited by examiner

LIGHT-EMITTING DEVICES HAVING AN ACTIVE REGION WITH ELECTRICAL CONTACTS COUPLED TO OPPOSING SURFACES THEREOF

RELATED APPLICATION

This application is a divisional application of U.S. patent application Ser. No. 10/818,619, filed Apr. 6, 2002, now U.S. Pat. No. 7,531,380, which claims the benefit of and priority to U.S. Provisional Patent Application No. 60/466,617, filed Apr. 30, 2003, the disclosures of which is hereby incorporated herein by reference as if set forth in its entirety.

BACKGROUND OF THE INVENTION

The present invention relates generally to microelectronic devices and fabrication methods therefor, and, more particularly, to light-emitting devices and fabrication methods therefor.

Light-emitting diodes (LEDs) are widely used in consumer and commercial applications. As is well known to those skilled in the art, a light-emitting diode generally includes a diode region on a microelectronic substrate. The microelectronic substrate may comprise, for example, gallium arsenide, gallium phosphide, alloys thereof, silicon carbide, and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with well entrenched incandescent and fluorescent lamps.

Referring now to FIG. 1, a conventional GaN-based LED 100 comprises a sapphire ($Al_2O_3$) substrate 105 that has first and second opposing surfaces 110a and 110b, respectively, and may be at least partially transparent to optical radiation. A diode region, comprising an n-type layer 115 and a p-type layer 120 is disposed on the second surface 110b and is configured to emit optical radiation upon application of a voltage across the diode region, for example across ohmic contacts 130 and 135.

The diode region including the n-type layer 115 and/or the p-type layer 125 may comprise gallium nitride-based semiconductor layers, including alloys thereof, such as indium gallium nitride and/or aluminum indium gallium nitride. The fabrication of gallium nitride layers is known to those skilled in the art, and is described, for example, in U.S. Pat. No. 6,177,688, the disclosure of which is hereby incorporated herein by reference. It will also be understood that a buffer layer or layers comprising aluminum nitride, for example, may be provided between the n-type gallium nitride layer 115 and the sapphire substrate 105, as described in U.S. Pat. Nos. 5,393,993, 5,523,589, 6,177,688, and application Ser. No. 09/154,363 entitled Vertical Geometry InGaN Light Emitting Diode, the disclosures of which are hereby incorporated herein by reference. The n-type gallium nitride layer 115 may comprise silicon-doped gallium nitride, while the p-type gallium nitride layer 120 may comprise magnesium-doped gallium nitride.

In some LEDs, the ohmic contact 135 for the p-type gallium nitride layer 120 comprises platinum, nickel and/or titanium/gold. In other LEDs, a reflective ohmic contact comprising, for example, aluminum and/or silver, may be used. The ohmic contact 130 to the n-type gallium nitride layer 115 may comprise aluminum and/or titanium. Other suitable materials that form ohmic contacts to p-type gallium nitride and n-type gallium nitride may be used for ohmic contacts 135 and 130, respectively. Examples of ohmic contacts to n-type gallium nitride layers and p-type gallium nitride layers are described, for example, in U.S. Pat. No. 5,767,581, the disclosure of which is hereby incorporated herein by reference.

Unfortunately, LED devices based upon a sapphire platform (i.e., fabricated on a sapphire wafer) typically use two contacts (anode and cathode) on the same side of the chip, such as the diode region side shown in FIG. 1. This may constrain the total number of die on a wafer. In addition, the use of two top side contacts may impact LED assemblers (i.e., packaging) as two wire bonds may be made.

SUMMARY OF THE INVENTION

According to some embodiments of the present invention, a light-emitting device comprises a substrate that has a contact plug extending therethrough between first and second opposing surfaces. An active region is on the first surface, a first electrical contact is on the active region, and a second electrical contact is adjacent to the second surface of the substrate. The contact plug couples the second electrical contact to the active region. Advantageously, such embodiments may allow electrical contacts to be on opposing sides of a chip, which may increase the number of devices that may be formed on a wafer.

In particular embodiments, an ohmic contact layer may be disposed between the first surface and the active region that comprises at least one of the following materials: TiN, platinum, nickel/gold, nickel oxide/gold, nickel oxide/platinum, Ti, and titanium/gold. The ohmic contact layer may also have a thickness between about 10 Å and about 100 Å and may be at least partially transparent.

In further embodiments, the substrate comprises a non-conductive material, such as sapphire, and the contact plug comprises a conductive material, such as gold, silver, gold alloys, and/or silver alloys. The first electrical contact may comprise platinum, nickel, and/or titanium/gold. The second electrical contact may comprise aluminum and/or titanium.

In still other embodiments, a light-emitting device may be formed by forming an active region on a first substrate. A second substrate may also be provided in which a via may be formed between first and second opposing surfaces. A contact plug may then be formed in the via. The active region from the first substrate may be transferred to the second substrate. Advantageously, the second substrate, which may be viewed as a "surrogate" substrate, may be selected to have particular material properties that may enhance light extraction from the light-emitting device structure.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
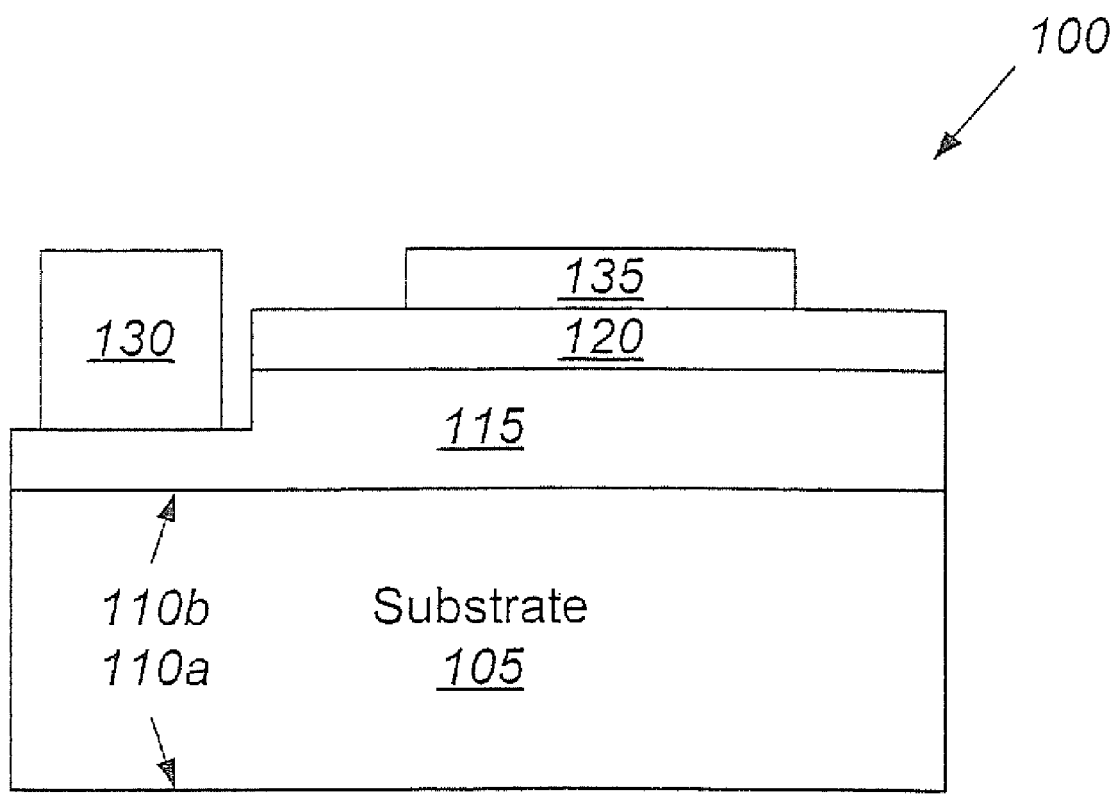
FIG. 1 is a cross-sectional diagram that illustrates a conventional GaN-based light-emitting diode (LED)

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. Each embodiment described herein also includes its complementary conductivity type embodiment.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second without departing from the teachings of the present invention.

Embodiments of the present invention will now be described, generally, with reference to GaN-based light-emitting diodes (LEDs) on non-conductive substrates, such as, for example, sapphire ($Al_2O_3$)-based substrates. The present invention, however, is not limited to such structures. Embodiments of the invention may use other substrates, including conductive substrates. Accordingly, combinations can include an AlGaInP diode on a GaP substrate, a GaN diode on a SiC substrate, an SiC diode on an SiC substrate, an SiC diode on a sapphire substrate, and/or a nitride-based diode on a gallium nitride, silicon carbide, aluminum nitride, zinc oxide and/or other substrate. Moreover, the present invention is not limited to the use of a diode region as an active region. Other types of active regions may also be used in accordance with some embodiments of the present invention.

Examples of light-emitting devices that may be used in embodiments of the present invention include, but are not limited to, the devices described in the following U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference. Other suitable LEDs and/or lasers are described in U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosures of which are incorporated herein as if set forth fully. Furthermore, phosphor coated LEDs, such as those described in U.S. patent application Ser. No. 10/659,241 entitled "PHOSPHOR-COATED LIGHT EMITTING DIODES INCLUDING TAPERED SIDEWALLS, AND FABRICATION METHODS THEREFOR," filed Sep. 9, 2003, the disclosure of which is incorporated by reference herein as if set forth full, may also be suitable for use in embodiments of the present invention.

The LEDs and/or lasers may be configured to operate in a "flip-chip" configuration such that light emission occurs through the substrate. In such embodiments, the substrate may be patterned so as to enhance light output of the devices as is described, for example, in U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosure of which is incorporated herein by reference as if set forth fully herein.

Figure 2A:
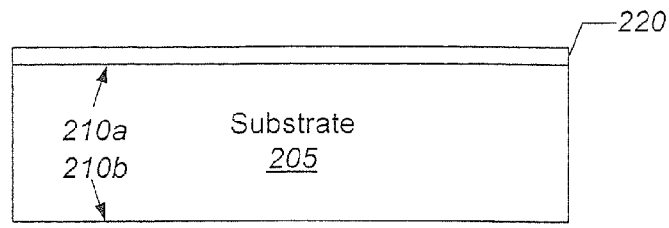
FIGS. 2A-2H are cross sectional diagrams that illustrate light-emitting devices and methods of forming same in accordance with various embodiments of the present invention.

Referring now to FIGS. 2A-2H, light-emitting devices and methods of forming same, in accordance with some embodiments of the present invention, will now be described. As shown in FIG. 2A, a substrate 205, such as, for example, a sapphire substrate, is provided. A sapphire substrate is generally non-conductive; however, as discussed above, conductive substrates may also be used in accordance with other embodiments of the present invention. The substrate 205 has a first surface 210a and a second surface 210b and may be at least partially transparent to optical radiation. An ohmic contact layer 220 may optionally be formed on the first surface 210a. In accordance with various embodiments of the present invention, the ohmic contact layer 220 may comprise TiN, platinum, nickel/gold, nickel oxide/gold, nickel oxide/platinum, Ti, titanium/gold and/or alloys thereof. The ohmic contact layer 220 may have a thickness between about 10 Å and about 100 Å and may be at least partially transparent to optical radiation in accordance with some embodiments of the present invention.

Figure 2B:
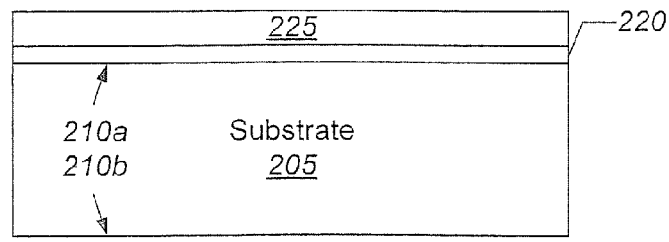
Figure 2C:
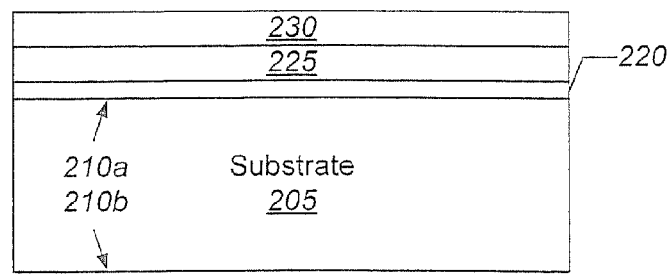

Referring now to FIGS. 2B and 2C, an active region, such as, for example, a diode region comprising an n-type layer 225 and a p-type layer 230 may be epitaxially grown on the ohmic contact layer 220. The diode region, including the n-type layer 225 and/or the p-type layer 230 may comprise gallium nitride-based semiconductor layers, including alloys thereof, such as indium gallium nitride and/or aluminum indium gallium nitride. The fabrication of gallium nitride layers is described, for example, in the above-incorporated U.S. Pat. No. 6,177,688. A buffer layer or layers comprising aluminum nitride, for example, may be provided between the n-type gallium nitride layer 225 and the substrate 205, as described in the above-incorporated U.S. Pat. Nos. 5,393,993, 5,523,589, 6,177,688, and application Ser. No. 09/154,363 entitled Vertical Geometry InGaN Light Emitting Diode. The n-type gallium nitride layer 225 may comprise silicon-doped gallium nitride, while the p-type gallium nitride layer 230 may comprise magnesium-doped gallium nitride.

Figure 2D:
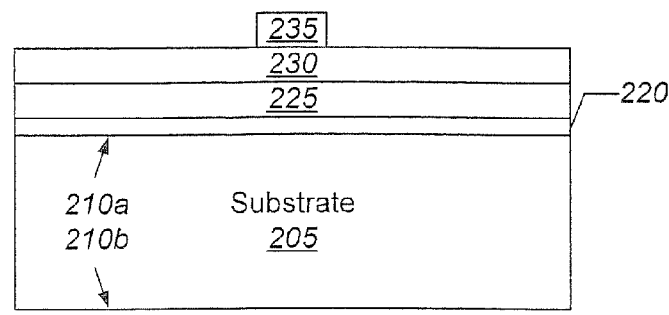

Referring now to FIG. 2D, a first electrical contact 235 is formed on the diode region as shown. The first electrical contact 235 for the p-type gallium nitride layer 230 may comprise platinum, nickel, titanium/gold and/or alloys thereof. In other embodiments, a reflective electrical contact comprising, for example, aluminum and/or silver, may be used. Other suitable materials that form ohmic contact to p-type gallium nitride may be used for the first electrical contact 235. Examples of ohmic contacts to p-type gallium nitride layers are described, for example, in the above-incorporated U.S. Pat. No. 5,767,581.

Figure 2E:
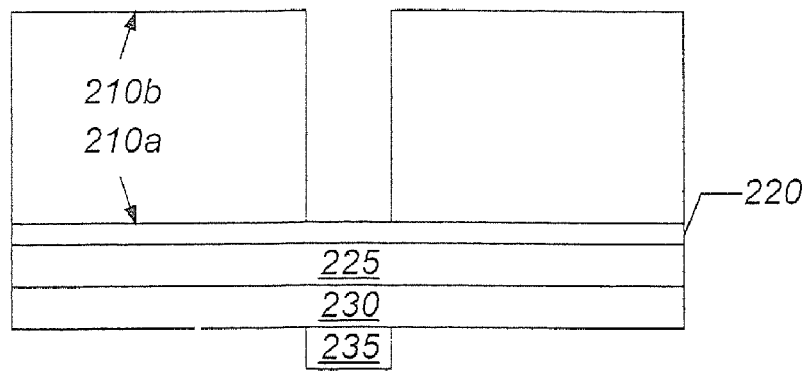

Referring now to FIG. 2E, a via is formed in the substrate 205 between the first and second surfaces 210a and 210b, respectively. In some embodiments, the via may be formed by etching the substrate 205 using the ohmic contact layer 220 as an etch stop layer. Various etching techniques may be used in accordance with different embodiments of the present invention, including, but not limited to, wet etching, dry etching, and micro-machining. In particular embodiments of the present invention, the via may be formed in substantial alignment with the first electrical contact 235 to reduce light loss due to "shading." In other embodiments, the via may be formed so that the via and the first electrical contact 235 are offset from one another. The offset configuration may be used to reduce stress on the gallium nitride-based layers 225 and 230.

Figure 2F:
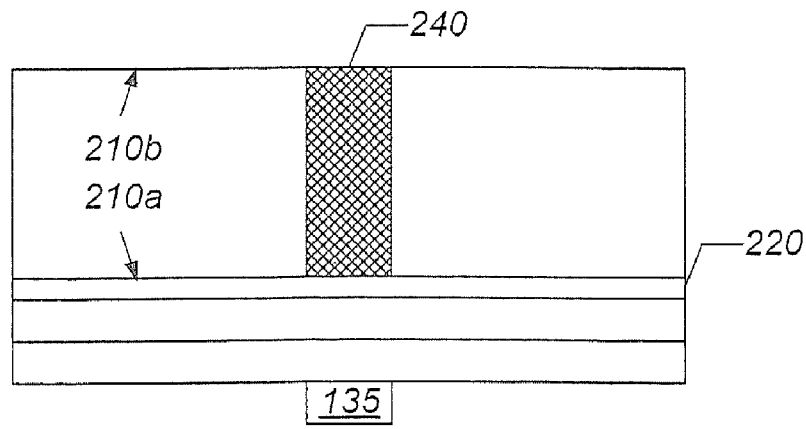

Referring now to FIG. 2F, a contact plug 240 is formed in the via by, for example, plating the via with a conductive material, such as gold, silver, gold alloys, and/or silver alloys, in accordance with some embodiments of the present invention.

Figure 2G:
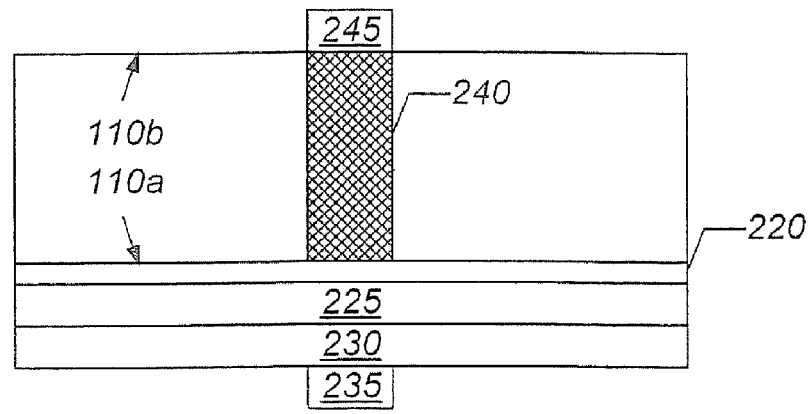
Figure 2H:
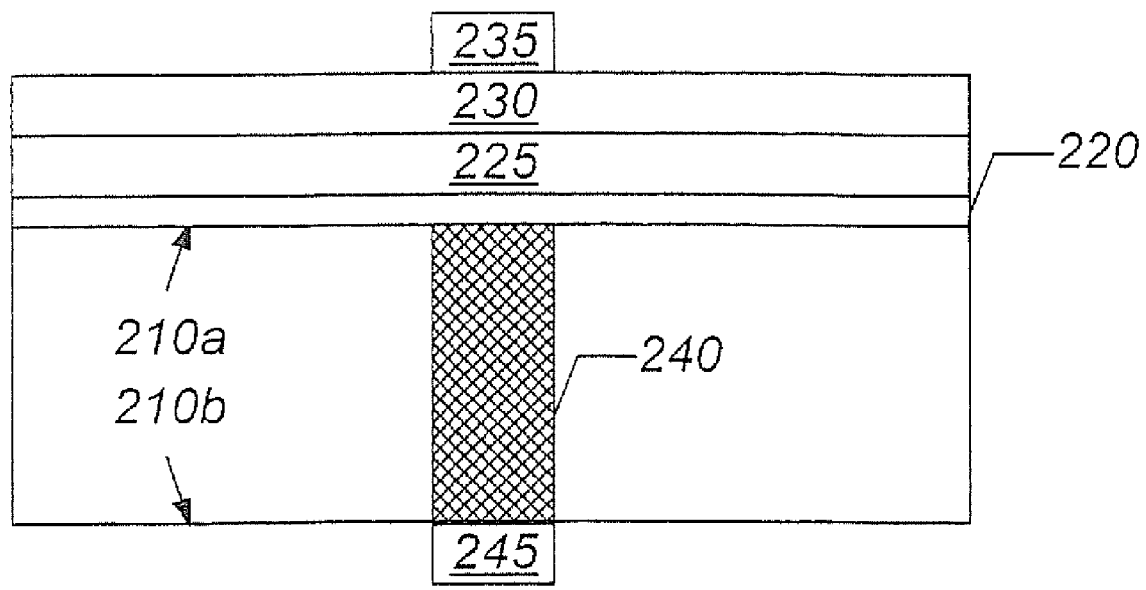

Referring now to FIG. 2G, a second electrical contact 245 is formed adjacent to the second surface 210b such that the contact plug 240 couples the second electrical contact 235 to the ohmic contact layer 220. Advantageously, because the ohmic contact layer 220 contacts the n-type gallium nitride layer 225 across a relatively broad surface area, improved current spreading may be provided. The second electrical contact 245 for the n-type gallium nitride layer 225 may comprise aluminum, titanium, and/or alloys thereof. Other suitable materials that form ohmic contact to n-type gallium nitride may be used for the second electrical contact 245. Examples of ohmic contacts to n-type gallium nitride layers are described, for example, in the above-incorporated U.S. Pat. No. 5,767,581. FIG. 2H shows the structure of FIG. 2G inverted with the diode region on top of the substrate 205.

Although described above with respect to non-conductive substrate embodiments, conductive substrates, such as SiC substrates, may also be used in accordance with other embodiments of the present invention. In such embodiments, a high resistivity SiC substrate may be used to reduce parasitic (free carrier) absorption. In addition, the forward biased diode offset voltage may be reduced by reducing the heterobarrier between the n-type SiC substrate and the n-type GaN layer.

Figure 3:
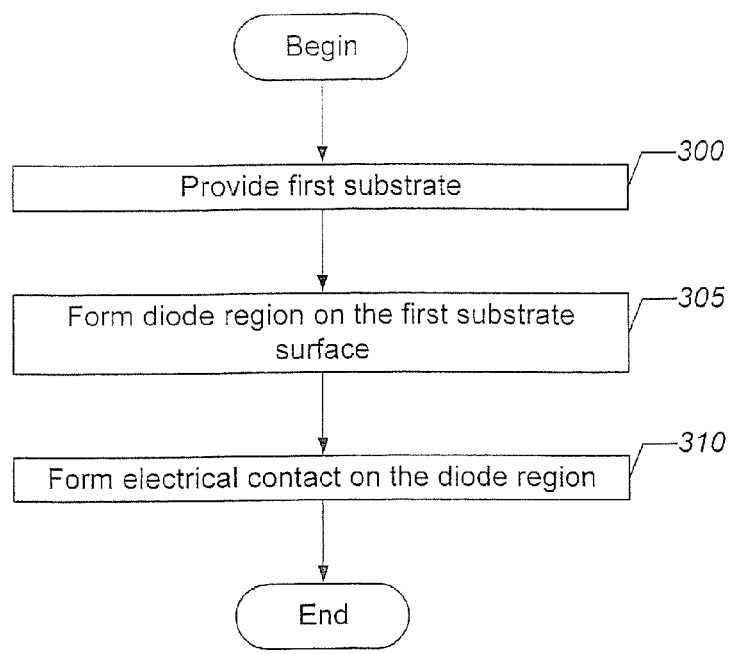
FIGS. 3-5 are flowcharts that illustrate exemplary operations for fabricating light-emitting devices in accordance with some embodiments of the present invention.

Exemplary operations for forming light-emitting devices, in accordance with some embodiments of the present invention, will now be described with reference to the flowcharts of FIGS. 3-5. Referring now to FIG. 3, operations begin at block 300 where a first substrate is provided. A diode region is formed on a surface of the first substrate at block 305 as described above with reference to FIGS. 2B and 2C. An electrical contact may then be formed on the diode region at block 310 as described above with reference to FIG. 2D.

Figure 4:
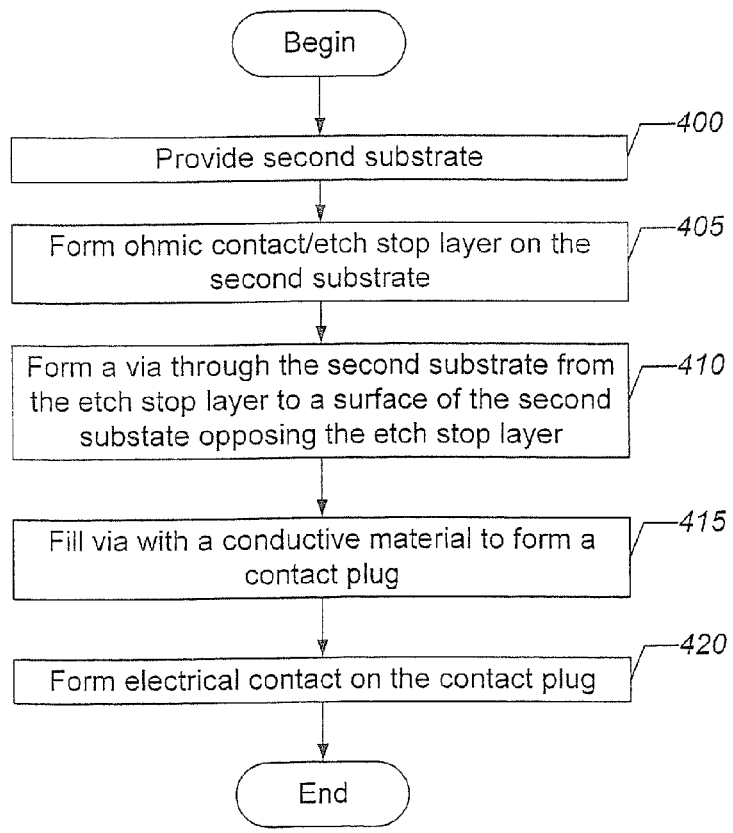

Referring now to FIG. 4, additional operations, which may be performed in parallel with the operations of FIG. 3, begin at block 400 where a second substrate is provided. An ohmic contact/etch stop layer may be formed on the second substrate as described above with reference to FIG. 2A. A via is then be formed in the second substrate at block 410 using, for example, the ohmic contact layer as an etch stop layer as described above with reference to FIG. 2E. At block 415, the via may be filled with a conductive material to form a contact plug as described above with reference to FIG. 2F. An electrical contact may then be formed on the contact plug at block 420 as described above with reference to FIG. 2G.

Figure 5:
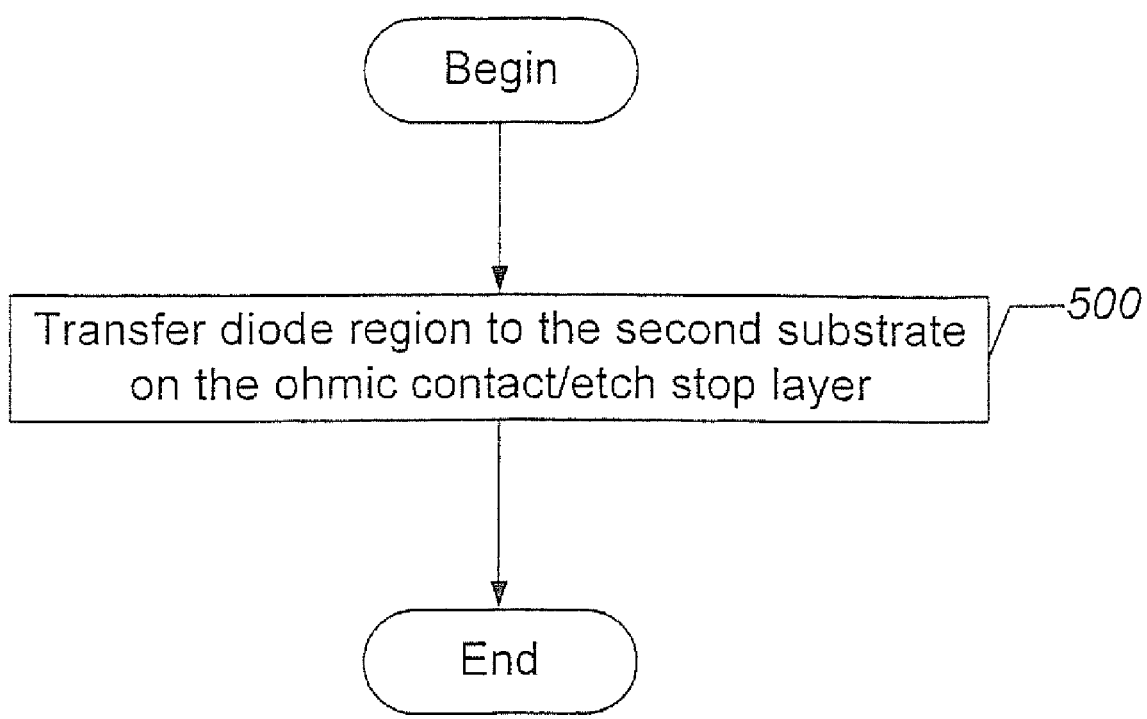

Referring now to FIG. 5, the diode region and the electrical contact disposed thereon is transferred from the first substrate to the second substrate, such that the diode region is disposed on the ohmic contact layer at block 500. Advantageously, the second substrate, which may be viewed as a "surrogate" substrate, may be selected to have particular material properties that may enhance light extraction from the light-emitting device structure.

Embodiments of the invention have been described above in which a diode is shown as an example of an active region. It should be understood, however, that an active region may include, but is not limited to, quantum wells, heterojunctions, homojunctions, multiple layers, combinations of the foregoing, or the like, in accordance with some embodiments of the present invention. For example, layers 225 and 230 may be embodied as described in the above-referenced patents and/or applications. Moreover, additional layers, such as lattice strain layers, may also be incorporated in light-emitting devices in accordance with further embodiments of the present invention.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A light-emitting device, comprising:
an active region;
a first electrical contact on a first surface of the active region;
a contact plug on a second surface of the active region;
a second electrical contact on the contact plug, the contact plug coupling the second electrical contact to the active region;
wherein the contact plug and the second electrical contact comprise different materials.

2. The light-emitting device of claim 1, further comprising:
an ohmic contact layer between the contact plug and the second surface of the active region.

3. The light-emitting device of claim 2, wherein the ohmic contact layer comprises at least one of TiN, platinum, nickel/gold, nickel oxide/gold, nickel oxide/platinum, Ti, and titanium/gold.

4. The light-emitting device of claim 2, wherein the ohmic contact layer has a thickness between about 10 Å and about 100 Å.

5. The light-emitting device of claim 1, wherein the ohmic contact layer is at least partially transparent.

6. The light-emitting device of claim 1, further comprising:
a substrate on the second surface of the active region;
wherein the contact plug extends through the substrate.

7. The light emitting device of claim 1, where the substrate comprises sapphire.

8. The light-emitting device of claim 1, wherein the contact plug comprises gold, silver, a gold alloys, and/or a silver alloy.

9. The light-emitting device of claim 1, wherein the first and second electrical contacts are substantially aligned with respect to each other.

10. The light-emitting device of claim 1, wherein the first and second electrical contacts are offset with respect to each other with respect to a axis perpendicular to the first and second surfaces of the active region.

11. The light-emitting device of claim 1, wherein the active region comprises:
   an n-type layer adjacent to the contact plug; and
   a p-type layer adjacent to the first electrical contact.

12. The light-emitting device of claim 11, wherein the n-type layer comprises GaN.

13. The light emitting device of claim 11, wherein the p-type layer comprises GaN.

14. The light-emitting device of claim 1, wherein the first electrical contact comprises at least one of platinum, nickel, and titanium/gold.

15. The light-emitting device of claim 1, wherein the second electrical contact comprises at least one of aluminum and titanium.

\* \* \* \* \*